United States Patent
Wang et al.

(10) Patent No.: US 8,335,105 B2
(45) Date of Patent: Dec. 18, 2012

(54) MAGNETIC MEMORY CELL

(75) Inventors: Hui-Chuan Wang, Pleasanton, CA (US); Tong Zhao, Fremont, CA (US); Kunliang Zhang, Milpitas, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1440 days.

(21) Appl. No.: 11/715,097

(22) Filed: Mar. 7, 2007

(65) Prior Publication Data

US 2008/0219042 A1 Sep. 11, 2008

(51) Int. Cl.
*G11C 11/14* (2006.01)

(52) U.S. Cl. ........ 365/171; 365/148; 365/158; 365/172; 977/933; 977/935

(58) Field of Classification Search .................. 257/421, 257/422, 427, E21.665, E27.006; 365/148; 438/3

See application file for complete search history.

(56) References Cited

U.S. PATENT DOCUMENTS

| | | | |
|---|---|---|---|
| 7,046,489 B2 | 5/2006 | Kamiguchi et al. | |
| 7,116,529 B2 | 10/2006 | Yoshikawa et al. | |
| 2004/0206619 A1* | 10/2004 | Pinarbasi | 204/192.2 |
| 2005/0243477 A1 | 11/2005 | Gill | |
| 2006/0002184 A1* | 1/2006 | Hong et al. | 365/171 |
| 2006/0209473 A1* | 9/2006 | Oshima et al. | 360/324.12 |
| 2007/0025029 A1* | 2/2007 | Hayakawa et al. | 360/324.2 |

FOREIGN PATENT DOCUMENTS

WO WO 2005/101373 * 10/2005

OTHER PUBLICATIONS

Co-pending Patent, U.S. Appl. No. 11/784,076, filed Apr. 15, 2007, assigned to the same assignee as present invention, "MR Device with Surfactant Layer within the Free Layer".

* cited by examiner

*Primary Examiner* — Richard Elms
*Assistant Examiner* — Harry W Byrne
(74) *Attorney, Agent, or Firm* — Saile Ackerman LLC; Stephen B. Ackerman

(57) ABSTRACT

By inserting a spin polarizing layer (typically pure iron) within the free layer of a MTJ or GMR memory cell, dR/R can be improved without significantly affecting other free layer properties such as Hc. Additional performance improvements can be achieved by also inserting a surfactant layer (typically oxygen) within the free layer.

19 Claims, 1 Drawing Sheet

FIG. 1 - Prior Art
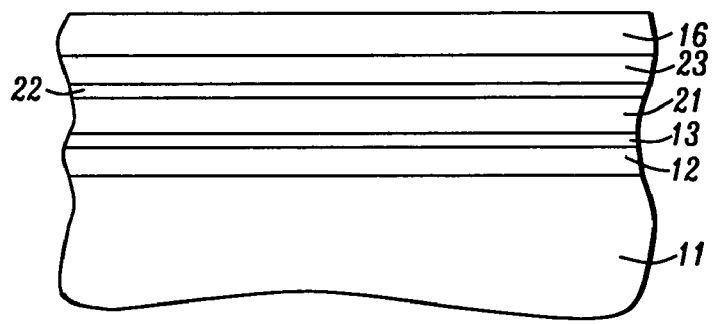
FIG. 2
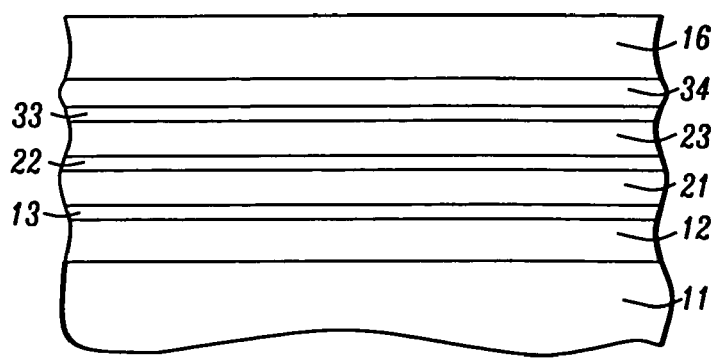
FIG. 3

MAGNETIC MEMORY CELL

This application is filed on Apr, 5, 2007 as application Ser. No. 11/784,076, and is herein incorporated, by reference, in its entirety.

FIELD OF THE INVENTION

The invention relates to the general field of magnetic memory cells including MTJ (magnetic tunnel junction) and GMR (giant magnetoresistance) devices, with particular reference to the structure of the free layer.

BACKGROUND OF THE INVENTION

A TMR (tunneling magneto-resistance) sensor (MTJ device) whose free layer is limited to FeCo (bcc) will have a large TMR ratio but other magnetic properties, such as Hc (coercive field), Hk (anisotropy field), and lambda (magnetostriction), will have values that fall well outside the usable range. In most current TMR manufacturing processes it is normal practice to deposit NiFe (fcc) as an additional component of the free layer in order to achieve a softer free layer. However, use of FeCo/NiFe as the free layer will also substantially reduce the TMR ratio (dR/R) compared to what may be achieved with a FeCo only free layer.

The present invention discloses a structure, and method for its manufacture, which makes it possible to achieve the high TMR ratio associated with a FeCo free layer without suffering an attendant degradation of other magnetic characteristics.

A typical MR memory cell of the prior art is illustrated in FIG. 1. Seen there are magnetic pinning layer 11 (normally an antiferromagnetic layer of a material such as IrMn or MnPt), magnetically pinned layer 12 (either a ferromagnetic layer or, more commonly, a synthetic antiferromagnetic trilayer), transition layer 13 (either copper for a GMR device or a thin insulating layer for a TMR device), CoFe layer 14, NiFe layer 15 (which, together with layer 14, makes up the free layer), and capping layer 16.

A routine search of the prior art was performed with the following references of interest being found:

U.S. patent application 2005/0243477 (Gill) discloses a thin layer of Fe (on the order of several Angstroms) may be added to the free layer adjacent to the coupling layer to assure antiparallel coupling. U.S. Pat. No. 7,116,529 (Yoshikawa et al) is an example of many patents that disclose a free layer comprising FeCo/NiFe. U.S. Pat. No. 7,046,489 (Kamiguchi et al) shows a free layer of Fe/CoFe/Fe or Fe/NiFe/Fe.

SUMMARY OF THE INVENTION

It has been an object of at least one embodiment of the present invention to attain a high dR/R ratio in a TMR or GMR memory element without pushing other magnetic properties of said memory element outside their acceptable limits Another object of at least one embodiment of the present invention has been to provide a structure that meets the preceding object along with a process for forming said structure.

Still another object of at least one embodiment of the present invention has been that the invention apply to TMR and also to CIP, CPP, and CCP type GMR devices.

A further object of at least one embodiment of the present invention has been that adoption of said process require that only minor changes be made to current processes for manufacturing said memory elements.

These objects have been achieved by inserting a spin polarizing layer (typically pure iron) within (as opposed to above or below) the free layer. Additional improvement can be obtained if, in addition to said spin polarizing layer, a surfactant layer (such as oxygen) is also inserted within the free layer. Data comparing the dR/R performance of prior art devices to devices made according to the teachings of the present invention is presented.

BRIEF DESCRIPTION OF THE DRAWINGS

FIG. 1 shows a typical memory element structure of the prior art.

FIG. 2 shows a memory element, similar to that of FIG. 1, modified according to an embodiment of the present invention wherein a spin polarizing layer has been inserted within the free layer.

FIG. 3 extends the example shown in FIG. 2 by inserting within the free layer, in addition to a spin polarizing layer, a surfactant layer.

DESCRIPTION OF THE PREFERRED EMBODIMENTS

The key innovation introduced by the present invention is the insertion of a thin layer of pure iron between the FeCo and NiFe layers of a conventional free layer. When this is done, the TMR ratio can be improved 15~20%, even with a very thin (2~10 Å) Fe layer. This TMR ratio improvement is due mainly to two major factors: (1) Fe has high spin polarization and (2) the thin Fe layer reduces Ni diffusion from the NiFe into the FeCo, thereby enabling the higher TMR ratio to be maintained. In addition to the higher TMR ratio, a magnetically softer free layer (lower Hc, Hk, etc.) is also obtained with this free layer structure.

The modified structure is illustrated in FIG. 2. As can be seen, it is similar to the prior art structure seen in FIG. 1 but with the key difference that, between layers 21 and 23 (which are equivalent to layers 14 and 15 in FIG. 1), spin polarizing layer 22 has been inserted. Our preferred material for layer 22 has been pure iron, but any spin polarizing material, such as FeB, could be substituted for the invention to still show an improvement in dR/R. Other, similar structures are also possible, for example FeCo/Fe/FeCo/NiFe.

An important question that needed to be answered at the outset was what effect, if any, insertion of the spin polarizing layer would have on the key magnetic properties of the free layer—Hc (coercivity), Hk (anisotropy field), and lambda ($\lambda$—magnetostriction coefficient). Experimental results are summarized in TABLE I:

TABLE I compares free layer properties (other than the TMR ratio) with and without an inserted thin 4 Angstrom Fe layer.

Sample structure: Seed/AFM/outer pinned/Ru/inner pinned/MgOx/Free/Cap

TABLE I

| Sample | Free | Hc | Hk | Lambda |
|---|---|---|---|---|
|  | FeCo/4Fe/NiFe | 3.03 | 11.08 | 2.0E−06 |
| Reference | FeCo/NiFe | 4.81 | 13.11 | 1.6E−06 to 2.5E−06 |

It can be seen in TABLE I that a magnetically softer free layer is obtained when a thin Fe layer is inserted into the FeCo/NiFe free layer. Additionally, magnetostriction exhibits almost no change relative to the prior art structure.

TABLE II presents experimental data for the R.A (resistance area product in ohms·μm$^2$) and the TMR ratio for a TMR device with a MgOx barrier and with Fe inserted into the FeCo/NiFe free layer.
Sample structure: Seed/AFM/outer pinned/Ru/inner pinned/MgOx/Free/Cap

TABLE II

| Sample | Free | RA | dR/R |
|---|---|---|---|
|  | FeCo/4Fe/NiFe | 3.48 | 58% |
| Reference | FeCo/NiFe | 3.50 | 48% |

From Table 2 we can see higher TMR ratio was obtained by thin Fe insertion in FeCo/NiFe free layer. With Fe inserted in between FeCo/NiFe free layer, a higher TMR ratio with reasonable free layer properties can still be expected.

FIG. 3 illustrates how, in addition to iron (i.e. spin polarizing) layer 22 being inserted within the free layer, further performance improvement can be obtained by also inserting a surfactant layer within the free layer (which is now made up of layers 21, 23, and 34). This is shown as layer 33 in the figure but it should be noted that, as long as the surfactant and iron layers are inserted somewhere within the free layer, their exact locations within the free layer are not critical. Layer 33 may comprise any of several known surfactant materials, such as oxygen, or oxygen mixed with argon, krypton, xenon, or neon, with oxygen being preferred.

What is claimed is:

1. A method to increase magneto-resistance of a magnetically free layer, comprising:
    providing a magnetic memory cell comprising a pinned layer on a pinning layer, a transition layer on said pinned layer, and said magnetically free layer on said transition layer, said magnetically free layer further comprising at least one layer containing cobalt and iron and at least one layer containing nickel and iron; and
    inserting within said magnetically free layer a spin polarizing layer.

2. The method of claim 1 wherein said spin polarizing layer is FeB.

3. The method of claim 1 wherein said spin polarizing layer is deposited to a thickness between about 2 and 10 Angstroms.

4. The method of claim 1 wherein said magnetic memory cell is a TMR device or a GMR device.

5. A process for forming, as part of a magnetic memory cell, that has a dR/R value, a free layer having a coercivity, an anisotropy field, and a magnetostriction coefficient, comprising:
    depositing a magnetic pinning layer on a substrate;
    depositing a magnetically pinned layer on said pinning layer;
    depositing a transition layer on said pinned layer;
    depositing, on said transition layer, a first ferromagnetic layer;
    depositing, on said first ferromagnetic layer, a layer of pure iron; and
    depositing, on said pure iron layer, a second ferromagnetic layer whereby said free layer, comprising said iron layer sandwiched between said first and second ferromagnetic layers, is formed.

6. The process of claim 5 wherein the step of depositing a first ferromagnetic layer further comprises depositing a single layer of cobalt iron.

7. The process of claim 5 wherein the step of depositing a second ferromagnetic layer further comprises depositing a single layer of nickel iron.

8. The process of claim 5 wherein omitting the step of depositing a layer of pure iron on said first ferromagnetic layer results in a magnetically free layer having a first coercivity of at least 4.8 Oe and wherein insertion of said layer of pure iron changes said first coercivity by less than 27%.

9. The process of claim 5 wherein omitting the step of depositing a layer of pure iron on said first ferromagnetic layer results in a magnetically free layer having a first anisotropy field of up to 13.11 Oe and wherein the step of inserting said layer of pure iron changes said first anisotropy field by less than 10%.

10. The process of claim 5 wherein omitting the step of depositing a layer of pure iron on said first ferromagnetic layer results in a magnetically free layer having a first magnetostriction coefficient between 1.6 E-06 and 2.5 E-06 and wherein the step of inserting said layer of pure iron changes said first magnetostriction coefficient by less than 10%.

11. The process of claim 5 wherein omitting the step of depositing a layer of pure iron on said first ferromagnetic layer results in a magnetic memory cell having a first dR/R value of at most 4,8% and wherein the step of inserting said layer of pure iron increases said first dR/R value by at least 20%.

12. A method to increase magneto-resistance of a magnetically free layer, comprising:
    providing a magnetic memory cell comprising a pinned layer on a pinning layer, a transition layer on said pinned layer, and said magnetically free layer on said transition layer, said magnetically free layer further comprising at least one layer containing cobalt and iron, at least one layer containing nickel and iron, and at least one layer containing three or more elements selected from the group consisting of nickel, cobalt, iron, and boron;
    inserting a spin polarizing layer between any two layers of said magnetically free layer; and
    inserting a surfactant layer between any two layers of said magnetically free layer.

13. The method of claim 12 wherein said spin polarizing layer is selected from the group consisting of iron and FeB.

14. The method of claim 12 wherein said surfactant layer is selected from the group consisting of $O_2$ mixed with Ar, $O_2$ mixed with. Kr, $O_2$ mixed with Xe, and $O_2$ mixed with Ne.

15. A magnetically free layer in a magnetic memory cell comprising:
    a pinned layer on a pinning layer;
    a transition layer on said pinned layer;
    on said transition layer, a layer of cobalt iron and a layer of nickel iron; and
    a spin polarizing layer between said layers of cobalt iron and nickel iron.

16. The free layer described in claim 15 wherein said spin polarizing layer is FeB.

17. A magnetically free layer in a magnetic memory cell comprising:
    a pinned layer on a pinning layer;
    a transition layer on said pinned layer;
    on said transition layer, at least one layer containing cobalt iron, at least one layer containing nickel iron, and at least one layer containing three or more elements selected from the group consisting of nickel, cobalt, iron, and boron;
    a spin polarizing layer between any two layers of said magnetically free layer; and a surfactant layer between any two layers of said magnetically free layer.

19. The magnetically free layer described in claim 17 wherein said spin polarizing layer is FeB.

19. The magnetically free layer described in claim 17 wherein said surfactant layer is selected from the group consisting of $O_2$ mixed with Ar, $O_2$ mixed with Kr, $O_2$ mixed with Xe, and $O_2$ mixed with Ne.

* * * * *

UNITED STATES PATENT AND TRADEMARK OFFICE
CERTIFICATE OF CORRECTION

PATENT NO. : 8,335,105 B2
APPLICATION NO. : 11/715097
DATED : December 18, 2012
INVENTOR(S) : Wingyu Leung It is certified that error appears in the above-identified patent and that said Letters Patent is hereby corrected as shown below:

In Column 1 after the Title, delete "This application is filed on April 5, 2007 as application Serial No. 11/784,076, and is herin incorporated by reference, in its entirety." and replace with -- This application is related to HT06-044, filed on April 5, 2007 as application Serial No. 11/784,076, and is herein incorporated, by reference, in its entirety. --.

Signed and Sealed this
Second Day of April, 2013

Teresa Stanek Rea
*Acting Director of the United States Patent and Trademark Office*